(12) United States Patent
Iinuma

(10) Patent No.: US 7,368,364 B2
(45) Date of Patent: May 6, 2008

(54) METHOD FOR MANUFACTURING ELEMENT ISOLATION STRUCTURAL SECTION

(75) Inventor: Taikan Iinuma, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 58 days.

(21) Appl. No.: 11/453,993

(22) Filed: Jun. 16, 2006

(65) Prior Publication Data
US 2006/0286765 A1 Dec. 21, 2006

(30) Foreign Application Priority Data
Jun. 17, 2005 (JP) .............................. 2005-177136

(51) Int. Cl.
*H01L 21/76* (2006.01)
(52) U.S. Cl. ............................... 438/424; 257/E21.546
(58) Field of Classification Search ................ 438/424; 257/E21.546
See application file for complete search history.

(56) References Cited

U.S. PATENT DOCUMENTS 6,717,231 B2* 4/2004 Kim et al. .................. 257/510
6,933,238 B2* 8/2005 Asakawa .................... 438/700
2006/0073671 A1* 4/2006 Iinuma ....................... 438/414
2006/0183296 A1* 8/2006 Yoo et al. ................... 438/424
2006/0205173 A1* 9/2006 Song et al. ................. 438/424

FOREIGN PATENT DOCUMENTS

JP 2000-022153 1/2000

* cited by examiner

*Primary Examiner*—Trung Dang
(74) *Attorney, Agent, or Firm*—Volentine & Whitt, P.L.L.C.

(57) ABSTRACT

A plurality of element forming regions and an element isolation structural section forming region which separates the plurality of element forming regions from one another, are set to a substrate. A first thermal oxide film is formed. An HfSiON film is formed. Heating processing is done. A silicon nitride film is formed. A trench is formed which extends from an upper surface of the substrate, corresponding to the element isolation structural section forming region to within the substrate. A trench oxide film is formed. A precursor embedded oxide film is formed. The precursor embedded oxide film is removed as a height lower than the upper surface of the silicon nitride film. Then, the silicon nitride film is removed. The HfSiON film and the first thermal oxide film are removed. A second thermal oxide film is formed on an exposed surface of the substrate from which the HfSiON film and the first thermal oxide film are removed. An embedded portion is formed as the same height as that of the exposed surface of the substrate.

8 Claims, 5 Drawing Sheets

METHOD FOR MANUFACTURING ELEMENT ISOLATION STRUCTURAL SECTION

BACKGROUND OF THE INVENTION

The present invention relates to a method for manufacturing an element isolation structural section, particularly, a so-called Shallow Trench Isolation (hereinafter called simply "STI") which separates a plurality of elements built in a semiconductor substrate from one another.

With developments in a semiconductor micro-fabrication technique, an element isolation method using a conventional LOCOS method is encountering difficulties in building element forming regions (hereinafter also called simply "active regions") with elements formed therein in thin widths and with satisfactory accuracy. In order to resolve such a problem, a shallow trench has been formed in a semiconductor substrate and element isolation based on an STI with the trench buried by a silicon oxide film has been carried out.

In a film structure removal process employed in an STI manufacturing method, however, a wet etching step has often been performed in general. Due to this wet etching, an unwanted recess called a divot often occurs in the neighborhood of a boundary between the STI and each active region.

When the divot occurs in the STI, for example, a film material for a polysilicon film formed in a gate electrode forming step remains within the divot. In doing so, there is a fear that the electrical characteristic of an element formed in each active region is degraded.

If an attempt is made to remove the film material having remained in the divot, then so-called overetching is carried out. There is however a fear that due to the overetching, for example, a gate oxide film formed in active region is damaged and the electrical characteristic of each element is degraded.

In order to solve such problems of STI associated with the divots, various STI manufacturing methods have been proposed.

There has been known, for example, a method for manufacturing an STI which has a trench having two-stage tapered angles, which is formed on a semiconductor substrate, a thermal oxide film formed in side and bottom faces of the trench, thermal oxide film sidewalls and a CVD oxide film both of which bury the trench, a gate oxide film, and gate polysilicon which covers the gate oxide film, the thermal oxide film sidewalls and the CVD oxide film from above, and wherein the thermal oxide film sidewalls protect upper end portions of the trench from the gate polysilicon (refer to a patent document 1 (Japanese Unexamined Patent Publication No. 2000-022153)).

According to the STI manufacturing process disclosed in the patent document 1, there are no disclosed the formation of a so-called pre-oxide film (sacrifice oxide film) corresponding to processing for cleaning a substrate surface at the formation of the gate polysilicon, its removal, and a height alignment step for allowing the heights of field and active regions immediately before the formation of the gate polysilicon to coincide with each other and planarizing them. Thus, there is a fear that the above problems associated with the divots cannot be resolved even depending on such a manufacturing process.

A problem also arises in that the manufacturing process is complex and the number of manufacturing steps increases.

SUMMARY OF THE INVENTION

It is therefore an object of the present invention to provide a technique for providing an element isolation structural section which is capable of preventing the occurrence of divots in a simple process and without impairing the electrical characteristics of elements formed in active regions and ensuring in-plane uniformity, and of adapting to developments in micro-fabrication technique.

The present invention has been made in view of the foregoing problems. In order to attain the above object, there is provided a method for manufacturing an element isolation structural section, according to the present invention, which includes the following steps.

That is, a plurality of element forming regions and an element isolation structural section forming region which separates the plurality of element forming regions from one another, are set to a substrate having an upper surface and a lower surface opposite to the upper surface upon manufacturing the element isolation structural section.

A first thermal oxide film is formed on the upper surface of the substrate. A film changed in etching rate by heat treatment is formed on the first thermal oxide film.

A silicon nitride film is formed on the film changed in etching rate by the heat treatment. The silicon nitride film, the film changed in etching rate by the heat treatment and the first thermal oxide film in the element isolation structural section forming region are removed, and a trench extending from the upper surface of the substrate corresponding to the element isolation structural section forming region to within the substrate is formed.

A trench oxide film which covers within the trench, is formed. An embedded oxide film which buries within the trench covered with the trench oxide film and covers exposed surfaces of the silicon nitride film and the first thermal oxide film, is formed.

The embedded oxide film is removed until the silicon nitride film is exposed and the height of the embedded oxide film is aligned with approximately the same height as that of the silicon oxide film within the element isolation structural section forming region.

The embedded oxide film set approximately identical in height to the silicon nitride film is removed as a height lower than an upper surface of the silicon nitride film.

The silicon nitride film is removed. The film changed in etching rate by the heat treatment and the first thermal oxide film are removed.

A second thermal oxide film is formed on an exposed surface of the substrate from which the film changed in etching rate by the heat treatment and the first thermal oxide film are removed.

The second thermal oxide film is removed, and the embedded oxide film is set to approximately the same height as that of an exposed surface of the substrate from which the second thermal oxide film is removed, whereby an embedded portion is formed.

According to the method for manufacturing the element isolation structural section, i.e., the STI, according to the present invention, for example, an HfSiON film corresponding to a film changed in etching rate by heat treatment is used as an alternative to a conventional so-called pad oxide film. By adjusting a temperature in a heating processing step, the HfSiON film is capable of adjusting its etching rate with hydrofluoric acid (HF) as an etchant. Thus, since the etching rate of the HfSiON film can be made larger than that of other film etched simultaneously, i.e., a precursor embedded oxide film, an excessive F/A (Field/Active) step subsequent to the removal of the HfSiON film leading up to the occurrence of divots can be made in a simpler process step and lower. Consequently, it is possible to ensure satisfactory in-plane uniformity while effectively preventing the occurrence of the divots. Thus, the electrical characteristics of elements separated by the STI can be prevented from degradation.

According to the STI manufacturing method of the present invention as well, since satisfactory in-plane uniformity can be realized, the present method can adapt even to further miniaturization of a manufacturing process.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENT

Figure 1:
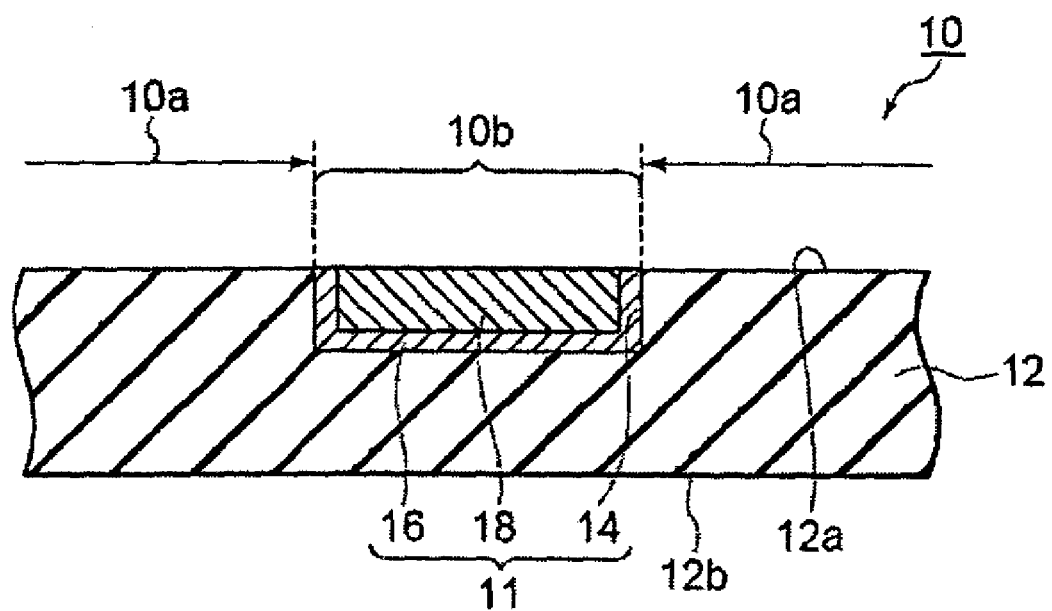
FIG. 1 is a typical fragmentary sectional view showing a cut section of a semiconductor device including an element isolation structural section of the present invention.

Preferred embodiments of the present invention will hereinafter be described with reference to the accompanying drawings. Incidentally, the shape, size and physical relationship of each constituent element or component in the figures are merely approximate illustrations to enable an understanding of the present invention. Therefore, the present invention is not limited only to examples illustrated in particular.

Although the specific materials, conditions and numerical conditions or the like might be used in the following description, they are no more than one of preferred examples. Accordingly, the present invention is by no means limited to these preferred examples.

Further, be cognizant of the fact that similar constituent elements illustrated in the respective figures used in the following description are given the same reference numerals, and their dual explanations might be omitted.

Configuration of Element Isolation Structural Section

A configurational example of an element isolation structural section according to the present invention will first be explained with reference to FIG. 1.

FIG. 1 is a typical fragmentary sectional view showing, in cut section, a semiconductor device including the element isolation structural section of the present invention.

For example, a semiconductor device corresponding to a semiconductor memory has a large number of elements such as transistors or the like built in a silicon substrate.

As shown in FIG. 1, a plurality of element forming regions (hereinafter also called "first regions") 10a and an element isolation structural section forming region (hereinafter also called "a second region") 10b are demarcated at a substrate 12 to perform element isolation among a plurality of elements. The first regions 10a are regions in which elements are built by a wafer process known to date per se in the art. The second region 10b is a region in which an element isolation structural section 11 for performing isolation between the elements is built.

The element isolation structural section 11 is built in the substrate 12. The substrate 12 has an upper surface 12a, and a lower surface 12b opposite to the upper surface 12a.

The element isolation structural section 11 has a trench section (hereinafter also called merely "a trench") 14. The trench 14 is provided as a depth which extends from the upper surface 12a of the substrate 12 to the midstream of thickness of the substrate 12, i.e., within the substrate 12. The depth, width, sectional shape and plane extending pattern of the trench 14 are set to arbitrary and suitable ones in consideration of the function of the semiconductor device 10, electrical characteristics required of elements to be built therein, etc.

A trench oxide film 16, which may preferably be uniform in thickness, is provided within the trench 14 along its inner wall surface. The trench oxide film 16 is of, for example, a thermal oxide film. The trench oxide film 16 is provided as a thin film which covers the entire exposed surface of the trench 14, e.g., the side and bottom faces of the trench 14. At this time, the trench oxide film 16 is not provided on an exposed surface of a silicon nitride film 30 to be described later and an exposed surface of a first thermal oxide film 20. While the trench oxide film 16 substantially holds a concave shape of the trench 14, a concave portion which still exists even after the formation of the trench oxide film 16 in the trench 14, is referred to as a trench portion.

Although the thickness of the trench oxide film 16 can be made arbitrary and suitable, its thickness may preferably range from, for example, 1 nm to 3 nm.

An embedded portion 18 is provided within the trench 14 covered with the trench oxide film 16. The embedded portion 18 is constituted of an insulating embedded material like, for example, silicon oxide. An exposed surface of the embedded portion 18 is formed as a flat surface aligned in height with the upper surface 12a of the substrate 12.

The plurality of elements built in the first regions 10a of the substrate 12 are separated from one another by the element isolation structural section 11 having such a structure.

Method for Manufacturing Element Isolation Structural Section

A specific process for manufacturing an element isolation structural section according to the present invention will be explained below with reference to FIGS. 2 through 5.

Figure 2A:
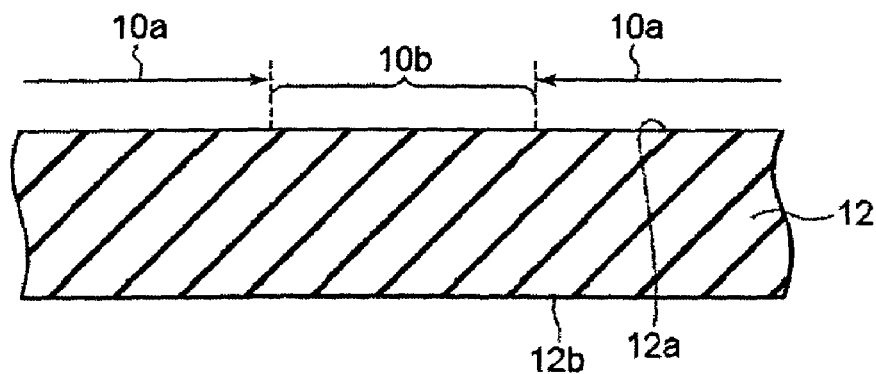
FIGS. 2(A), 2(B) and 2(C) are respectively schematic fragmentary sectional views showing, in cut section, a semiconductor device including an element isolation structural section being in process of its manufacture.
Figure 2B:
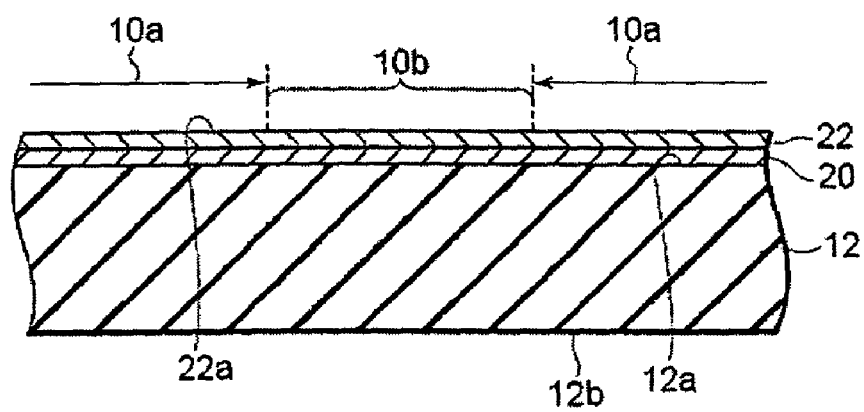
Figure 2C:
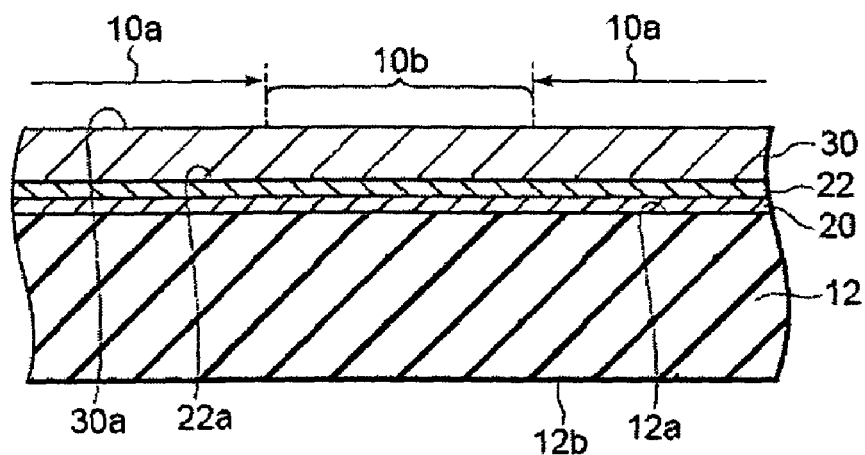
Figure 3A:
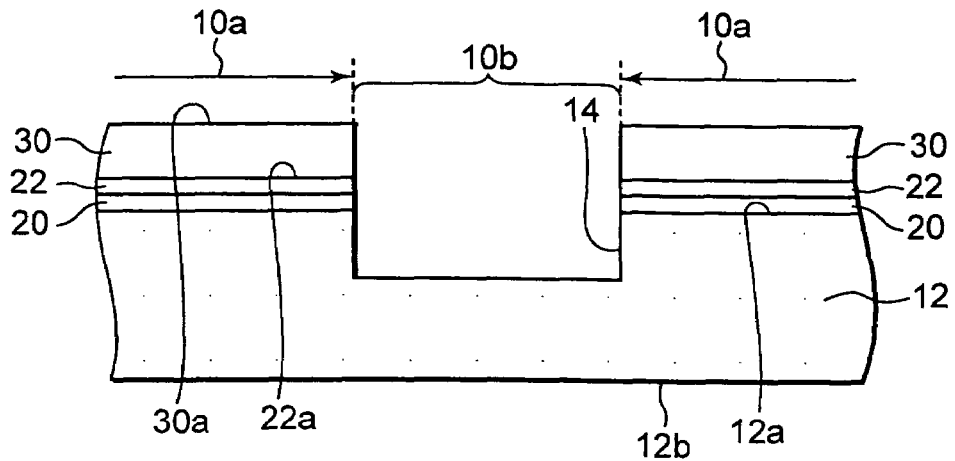
FIGS. 3(A), 3(B) and 3(C) are respectively typical explanatory views following FIG. 2.
Figure 3B:
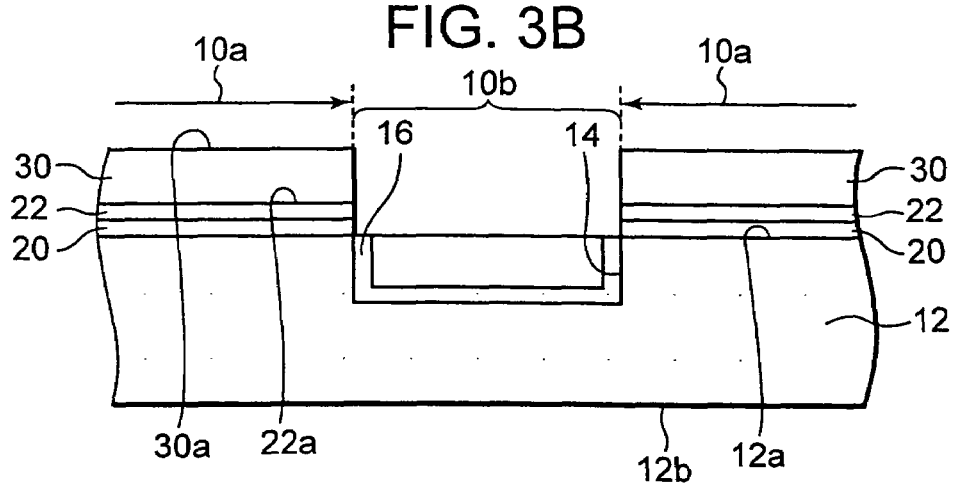
Figure 3C:
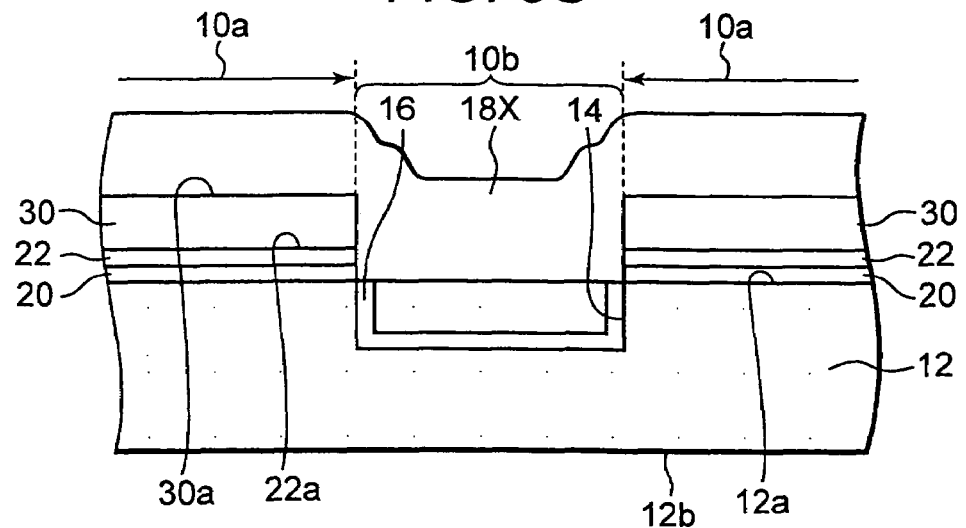
Figure 4A:
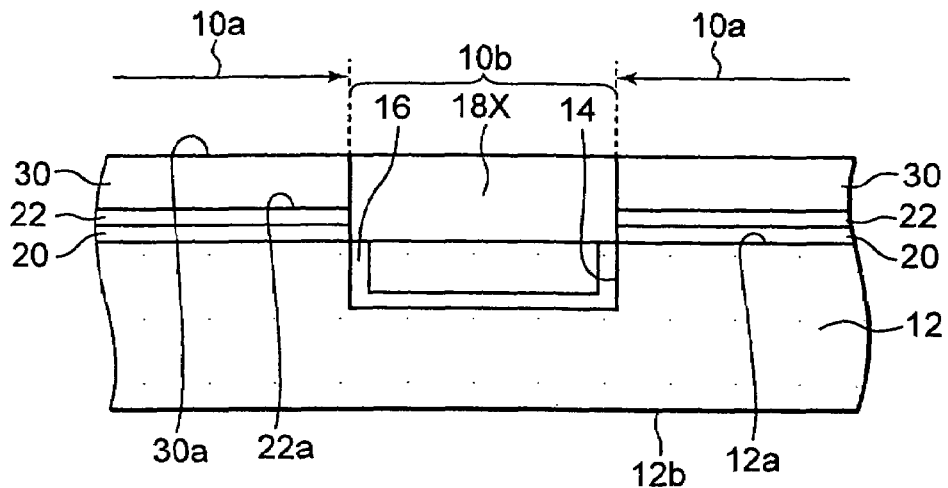
FIGS. 4(A), 4(B) and 4(C) are respectively typical explanatory views following FIG. 3.
Figure 4B:
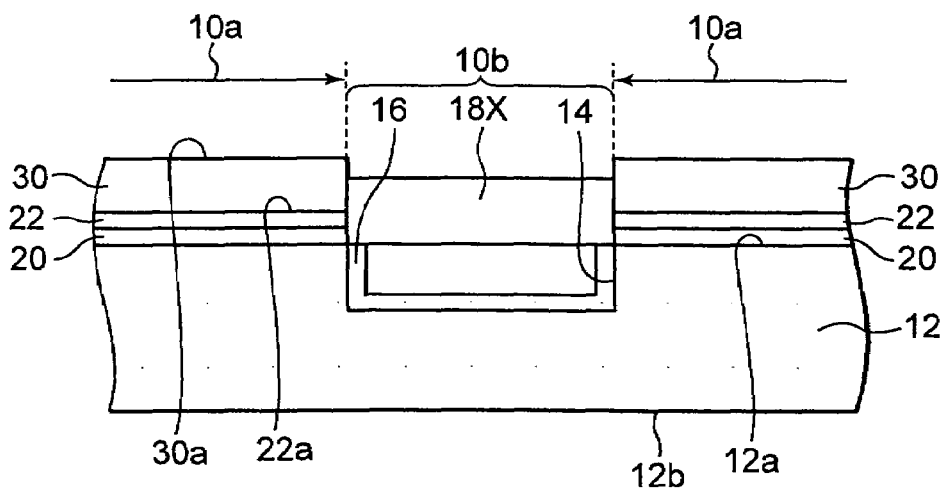
Figure 4C:
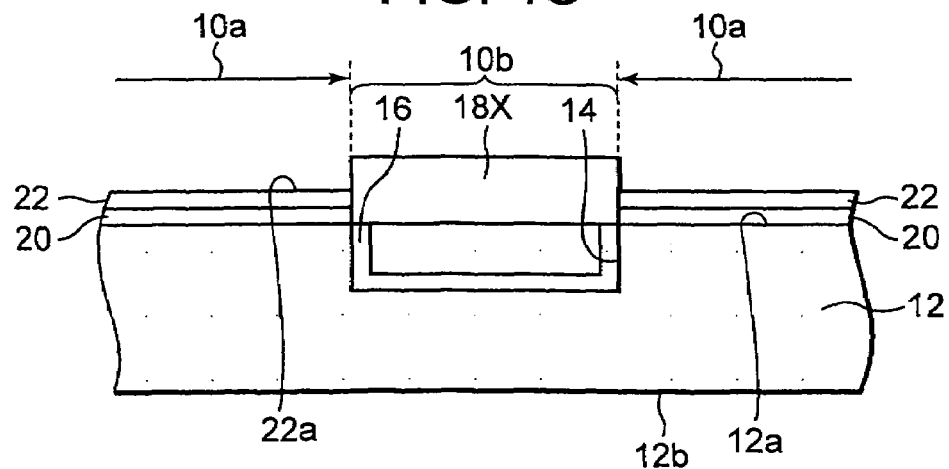
Figure 5A:
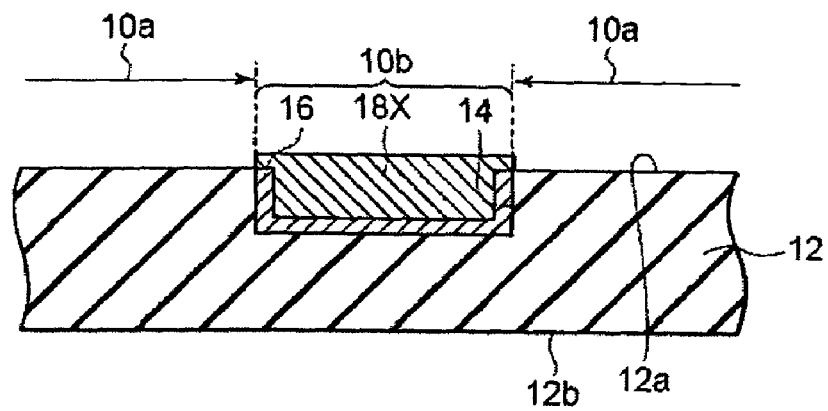
FIGS. 5(A), 5(B) and 5(C) are respectively typical explanatory views following FIG. 4.
Figure 5B:
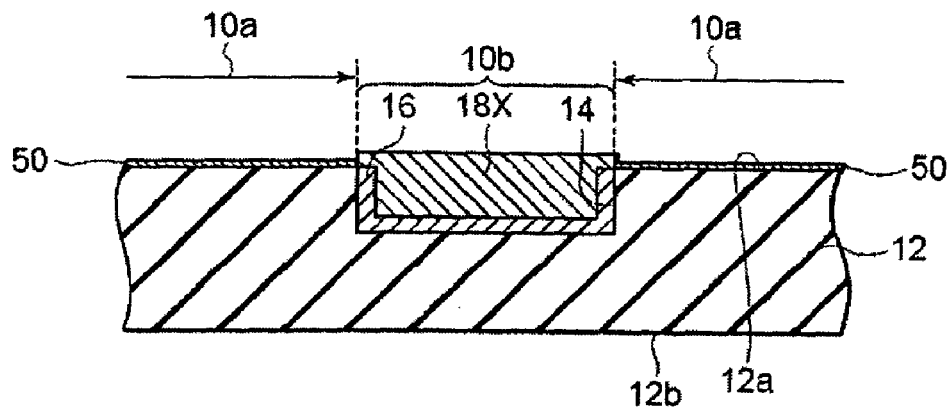
Figure 5C:
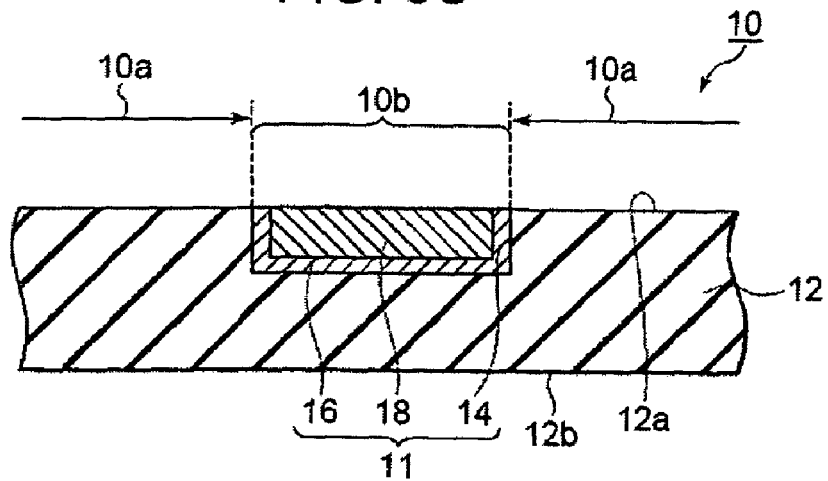

FIGS. 2(A), 2(B) and 2(C) are respectively schematic fragmentary sectional views showing, in cut section, a semiconductor device including an element isolation structural section being in the process of its manufacture. FIGS. 3(A), 3(B) and 3(C) are respectively typical explanatory views following FIG. 2. FIGS. 4(A), 4(B) and 4(C) are respectively typical explanatory views following FIG. 3. FIGS. 5(A), 5(B) and 5(C) are respectively typical explanatory views following FIG. 4.

A substrate 12 is prepared as shown in FIG. 2(A). A plurality of element forming regions, i.e., first regions 10a, and an element isolation structural section forming region that surrounds the first regions 10a, i.e., a second region 10b are set to the substrate 12 in accordance with the design of a targeted semiconductor device 10.

Next, as shown in FIG. 2(B), a first thermal oxide film 20 is formed on the upper surface 12a of the substrate 12. The first thermal oxide film 20 is a so-called Interfacial Layer (hereinafter also called simply "IFL") oxide film. The IFL oxide film is of a film for separating a film deposited on the substrate 12 in a process to be described later and the substrate from each other and preventing the deposited film from exerting a bad influence on the substrate 12. The thickness of the first thermal oxide film 20 may preferably be 1 nm or so.

The first thermal oxide film 20 can be formed by an arbitrary and suitable method known to date per se in the art. Preferably, the first thermal oxide film 20 may be formed by a radical oxidation process or a thermal oxidation process such as an ISSG (In Situ Steam Generation) method. Such a thermal oxidation process may preferably be performed as, for example, a wet oxidation process at 850° C.

Further, a film corresponding to a film changed in etching rate by heat treatment, preferably, e.g., an HfSiON (nitride hafnium silicate) film 22 is formed on the first thermal oxide film 20. The HfSiON film 22 is deposited and formed under the deposition conditions known to date, using a conventionally known MOCVD apparatus by a MOCVD method, for example.

Described specifically, the deposition process may be performed by allowing, for example, HTB (Hafnium tetra-t-butoxide)/SiH$_4$ or HTB/Si$_2$H$_6$ to react at 300° C. or so.

The HfSiON film 22 is used as an alternative to a conventional so-called pad oxide film. In general, the thickness of the pad oxide film is determined by taking into consideration the thickness of a silicon nitride film provided on the pad oxide film. If the thickness of the pad oxide film is set to, for example, about one tenth the thickness of the silicon nitride film, it is possible to prevent the influence of the silicon nitride film on the substrate.

Thus, the thickness of the HfSiON film 22 may be set to such an extent that the adverse effect of the silicon nitride film 30 provided on the surface 22a of the HfSiON film 22 on the substrate 12 can be prevented.

Thereafter, heating or heat treatment may preferably be carried out. This heat treatment is performed to adjust an etching rate of the HfSiON film 22 with respect to hydrofluoric acid (HF). A condition for the heat treatment can be set to one made in accordance with the method known to date per se in the art.

Although described later in detail, the etching rate of the HfSiON film 22 with respect to the hydrofluoric acid (HF) can also be adjusted low and high by such heat treatment as compared with an etching rate under the same condition, of an oxide film (hereinafter also called "HDP oxide film") formed by a high-density plasma CVD method to be described later.

The HfSiON film 22 can bring about a substrate protecting effect even though the heat treatment is not performed. The etching rate of the HfSiON film 22 in this case is much larger than the etching rate of the HDP oxide film (its details will be described later). Thus, when it is not necessary to perform the adjustment to the etching rate of the HfSiON film 22 with respect to the hydrofluoric acid (HF) by the heat treatment in consideration of the thickness of the HfSiON film 22, the thickness of the HDP oxide film, etc., the heat treatment process may not be executed.

A description will now be made of a change in the etching rate of the HfSiON film with respect to the hydrofluoric acid (HF) by the heat treatment. The etching rate of the IFL oxide film used as the thermal oxide film is not affected by the heat treatment.

As a heating temperature for the heat treatment increases, the etching rate of the HfSiON film decreases.

The heat treatment temperature in the heat treatment process may preferably be set to a temperature at which the etching rate of the HfSiON film becomes larger than the etching rate of the HDP oxide film in the same process under the same condition.

Although no data is shown, the etching rates of the IFL oxide film (thermal oxide film) and HDP oxide film become approximately equal to the etching rate of the HfSiON film heat-treated at about 970° C.

Accordingly, the heat treatment temperature may preferably be set to a temperature less than or equal to 970° C., i.e., about 970° C. even at the maximum.

Thus, if the etching rate of the HfSiON film with respect to the hydrofluoric acid is adjusted, it is then possible to reduce a steplike offset or a step between the HDP oxide film and the substrate surface subsequent to the removal of the first thermal oxide film 20 and the HfSiON film 22, i.e., a F/A step, thereby making it possible to form a high-quality STI free of the existence of divots.

Next, as shown in FIG. 2(C), a silicon nitride film 30 is formed on the surface 22a of the HfSiON film 22. The silicon nitride film 30 can be formed by, for example, a reduced pressure CVD method. The thickness of the silicon nitride film 30 may be formed as, for example, 150 nm or so.

Next, the silicon nitride film 30, HfSiON film 22 and first thermal oxide film 20 of the second region 10b are removed as shown in FIG. 3(A). This removal process step may be performed in accordance with the photolithography process and etching process known to date.

The substrate surface 12a exposed to the second region 10b by the above removal process step is further etched to form a trench 14 which extends from the upper surface 12a of the substrate 12 to within the substrate.

Next, a trench oxide film 16 is formed as shown in FIG. 3(B). The trench oxide film 16 is a thermal oxide film which covers within the trench 14. The trench oxide film 16 can be formed by the arbitrary and suitable method known to date under predetermined conditions suitable for the semiconductor device. Preferably, the trench oxide film 16 may be formed by, for example, the radical oxidation process or the thermal oxidation process such as the ISSG (In Situ Steam Generation) method.

Next, as shown in FIG. 3(C), a precursor embedded oxide film (film formed as an embedded oxide film in a subsequent process, which is also called simply "an embedded oxide film") 18X is formed. The precursor embedded oxide film 18X is formed so as to bury the interior of the trench 14 covered with the trench oxide film 16. Then, the precursor oxide film 18X is formed so as to cover the respective exposed surfaces of the silicon nitride film 30, HfSiON film 22 and first thermal oxide film 20. The precursor embedded oxide film 18X can be formed as a silicon oxide film in accordance with the method known to date per se in the art by, preferably, the high-density plasma CVD method (HDP). That is, the precursor embedded oxide film 18X corresponds to the HDP oxide film referred to above. The thickness of the precursor embedded oxide film 18X may preferably be set to, for example, about 550 to 700 nm.

Further, as shown in FIG. 4(A), the precursor embedded oxide film 18X is removed such that the silicon nitride film 30 is exposed in each first region 10a, and the precursor embedded film 18X is removed until its height is aligned with approximately the same height as the exposed upper surface 30a of the silicon nitride film 30 within the second region 10b. The "approximately the same height" mentioned here means that their heights are identical to each other or may be different from each other to such a degree as not to impair the object of the present invention and the electrical characteristics of a desired semiconductor device.

Preferably, this process may be performed by the chemical mechanical polishing (CMP) method known to date, in which the silicon nitride film 30 is used as a stopper film. With this process, the precursor embedded oxide film 18X is made flush with the exposed surface, i.e., the upper surface 30a of the silicon nitride film 30.

Next, as shown in FIG. 4(B), the precursor embedded oxide film 18X is removed over part of its thickness as viewed from its exposed surface side. A newly-formed flat upper surface of the precursor embedded oxide film 18X is set to a height lower than that of the upper surface 30a of the silicon nitride film 30 with the lower surface 12b of the substrate 12 as the reference. This process step is a step for adjusting the F/A step subsequent to the removal of the silicon nitride film 30.

The thickness of the precursor embedded oxide film 18X caused to remain after such a removal process step may be set to a height obtained by the inverse operation or calculation in such a manner that when the HfSiON film 22 and the first thermal oxide film 20 are removed by etching in a subsequent process step and thereafter a second thermal oxide film 50 (refer to FIGS. 5(B) and 5(C)) to be described later is removed by etching, the upper side portion of the precursor embedded oxide film 18X is removed by both etching and its newly-formed upper surface is made flush with the substrate surface (exposed surface of substrate) 12a (refer to FIG. 5(C)). That is, the thickness of the precursor embedded oxide film caused to remain at this time may be set in such a manner that a height given as the product of both the sum (unit:time) of a time interval during which the first thermal oxide film and the HfSiON film are removed and a time interval during which the second thermal oxide film is removed, and an etching rate of the precursor embedded oxide film under a predetermined condition becomes a thickness that protrudes from a new substrate surface subsequent to the removal of the second thermal oxide film.

A process step for removing the precursor embedded oxide film (HDP oxide film) may be performed by, specifically, hydrofluoric acid (HF) processing known to date. This HF processing may preferably be performed with the concentration of hydrofluoric acid as 5 wt %, for example.

Next, as shown in FIG. 4(C), the silicon nitride film 30 is removed. This removal step may be performed by an etching process step using phosphoric acid under arbitrary and suitable conditions known to date.

Next, as shown in FIG. 5(A), the HfSiON film 22 and the first thermal oxide film 20 are removed. This removal process step can be carried out under arbitrary and suitable conditions. It may preferably be performed by, for example, hydrofluoric acid processing with the concentration of hydrofluoric acid as 5 wt %.

While the HfSiON film 22 and the first thermal oxide film 20 are removed by the hydrofluoric acid processing, the HDP oxide film, i.e., the precursor embedded oxide film 18X is also chipped away at this time and hence its height becomes low.

Further, as shown in FIG. 5(B), the second thermal oxide film 50 is formed on the exposed surface of the substrate 12 from which the HfSiON film 22 and the first thermal oxide film 20 are removed, i.e., the first regions 10a. This thermal oxidation process is aimed at cleaning the substrate upper surface prior to the formation of a gate oxide film. A step for forming the second thermal oxide film 50 can be carried out by an arbitrary and suitable method known to date. Preferably, the second thermal oxide film may be formed by, for example, the radical oxidation process or the thermal oxidation process such as the ISSG (In Situ Steam Generation) method.

With the formation of the second thermal oxide film 50, the height of each first region 10a becomes slightly high, and the substrate surface 12a is slightly retracted. That is, the thickness of the substrate 12 becomes slightly thin.

Thereafter, the second thermal oxide film 50 is removed as shown in FIG. 5(C). This removal process step may be performed by a process step similar to the above hydrofluoric acid processing. Described specifically, preferably, for example, the hydrofluoric acid processing is performed under arbitrary and suitable conditions, followed by execution of washing. Then, processing based on the hydrochloric peroxide mixture (HPM) known to date is performed with, for example, its solution temperature as 70° C.

The precursor embedded oxide film 18X is also simultaneously chipped away by the step for removing the second thermal oxide film 50 by the hydrofluoric acid. That is, the precursor embedded oxide film 18X becomes approximately the same height as that of the substrate's exposed surface from which the second thermal oxide film 50 is removed, and an embedded portion 18 aligned in height with the exposed new upper surface 12a is completed.

Afterwards, spin drying is effected on the substrate.

In accordance with the above process steps, the element isolation structural section 11 of the present invention is completed.

A wafer process, which complies with the method known to date per se in the art, is performed to build elements such as transistors in their corresponding element forming regions, after which a desired semiconductor device may be manufactured.

A description will now be made of the reasons why the F/A step can be reduced by adjusting the etching rate of the HfSiON film 22 by the heat treatment.

Upon forming (element formation) the elements in the plurality of element forming regions separated from one another by the element isolation structural sections (STI) respectively, it is necessary that the element forming regions and each element isolation structural section are aligned in height with one another and flat.

That is, the first thermal oxide film (IFL oxide film), HfSiON film and second thermal oxide film (pre-oxide film) are respectively removed from the element forming regions in a state in which the HDP oxide film is being provided therein. Simultaneously with these process steps, the HDP oxide film is also chipped away and hence its height becomes low.

Thus, it is necessary to finally equalize the time interval during which the first thermal oxide film, HfSiON film and second thermal oxide film are chipped away and removed, and the time interval during which the HDP oxide film is chipped away up to the same height as that of the substrate surface subsequent to the removal of the second thermal oxide film, in such a manner that when the second thermal oxide film is removed, the element isolation structural section and the element forming regions continue as a flat surface.

The first thermal oxide film may preferably be formed as an extra-thin film of 1 nm or so as described above, and the HfSiON film is defined based on the thickness of the nitride film provided on its upper side.

The occurrence of the already-described divots result from the fact that the step between the upper surface of the HfSiON film and the HDP oxide film that protrudes high from the upper surface thereof is large upon the step for removing the HfSiON film and the first thermal oxide film.

That is, the etching rate of the HDP oxide film with respect to the hydrofluoric acid is about 1.6 times larger than the etching rate of the thermal oxide film conventionally used as the pad oxide film.

For instance, the etching rate of a thermal oxide film using hydrofluoric acid at a concentration of 5 wt % is about 300 nm/min, whereas the etching rate of the HDP oxide film under the same condition is about 480 nm/min. Thus, the HDP oxide film is more chipped away during the same time as compared with the thermal oxide film upon the removal step of the pad oxide film. Since this etching step is isotropic etching, exposed side portions of the F/A step are isotropically chipped away. Due to it, the divots take place as described above.

Thus, if the etching rate of the HfSiON film used as an alternative to the pad oxide film can be made larger, then the height of the HDP oxide film can be reduced in advance. It is therefore possible to set lower the height of the HDP oxide film at the removal of the HfSiON film and the first thermal oxide film, i.e., the F/A step.

That is, the area of each sidewall (side face) of the HDP oxide film, which protrudes to the position higher than the upper surface of the HfSiON film and is exposed thereat, can be reduced smaller upon the etching step for the HfSiON film and the first thermal oxide film. It is thus possible to effectively prevent the occurrence of divots.

While the preferred form of the present invention has been described, it is to be understood that modifications will be apparent to those skilled in the art without departing from the spirit of the invention. The scope of the invention is to be determined solely by the following claims.

FIG. 1 STRUCTURE OF STI
FIG. 2 MANUFACTURING PROCESS OF STI
FIG. 3 MANUFACTURING PROCESS OF STI
FIG. 4 MANUFACTURING PROCESS OF STI
FIG. 5 MANUFACTURING PROCESS OF STI

What is claimed is:

1. A method for manufacturing an element isolation structural section, comprising the steps of:
    setting to a substrate having an upper surface and a lower surface opposite to the upper surface, a plurality of element forming regions and an element isolation structural section forming region which separates the plurality of element forming regions from one another;
    forming a first thermal oxide film over the upper surface of the substrate;
    forming a film changed in etching rate by heat treatment over the first thermal oxide film;
    forming a silicon nitride film over the film changed in etching rate by the heat treatment;
    removing the silicon nitride film, the film changed in etching rate by the heat treatment and the first thermal oxide film in the element isolation structural section forming region and forming a trench extending from the upper surface of the substrate corresponding to the element isolation structural section forming region to within the substrate;
    forming a trench oxide film which covers within the trench;
    forming an embedded oxide film which buries within the trench covered with the trench oxide film and covers exposed surfaces of the silicon nitride film, the film changed in etching rate by the heat treatment and the first thermal oxide film;
    removing the embedded oxide film until the silicon nitride film is exposed and the height of the embedded oxide film is aligned with approximately the same height as that of the silicon nitride film within the element isolation structural section forming region;
    removing the embedded oxide film set approximately identical in height to the silicon nitride film as a height lower than an upper surface of the silicon nitride film;
    removing the silicon nitride film;
    removing the film changed in etching rate by the heat treatment and the first thermal oxide film;
    forming a second thermal oxide film over an exposed surface of the substrate from which the film changed in etching rate by the heat treatment and the first thermal oxide film are removed; and
    removing the second thermal oxide film and setting the embedded oxide film to approximately the same height as that of an exposed surface of the substrate from which the second thermal oxide film is removed.

2. The method according to claim 1, further including a step for performing heating after the step for forming the film changed in etching rate by the heat treatment.

3. The method according to claim 2, wherein a heating temperature in the heating performing step is set to a temperature at which the etching rate of the film changed in etching rate by the heat treatment becomes larger than that of the embedded oxide film under the same condition.

4. The method according to claim 2 or 3, wherein the heating temperature is set to 970° C. even at the maximum.

5. The method according to claim 1, wherein the step for forming the film changed in etching rate by the heat treatment is a step for forming an HfSiON film.

6. The method according to claim 2, wherein the step for forming the film changed in etching rate by the heat treatment is a step for forming an HfSiON film.

7. The method according to claim 3, wherein the step for forming the film changed in etching rate by the heat treatment is a step for forming an HfSiON film.

8. The method according to claim 4, wherein the step for forming the film changed in etching rate by the heat treatment is a step for forming an HfSiON film.

* * * * *